(12) United States Patent
Usui

(10) Patent No.: US 9,508,639 B2
(45) Date of Patent: Nov. 29, 2016

(54) PACKAGE-IN-SUBSTRATE, SEMICONDUCTOR DEVICE AND MODULE

(71) Applicant: ROHM CO., LTD., Ukyo-ku, Kyoto (JP)

(72) Inventor: Hirotoshi Usui, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/819,755

(22) Filed: Aug. 6, 2015

(65) Prior Publication Data

US 2016/0043028 A1 Feb. 11, 2016

(30) Foreign Application Priority Data

Aug. 6, 2014 (JP) ................. 2014-160649

(51) Int. Cl.
*H01L 23/495* (2006.01)
*H01L 23/498* (2006.01)
*H01L 23/31* (2006.01)
*H01L 23/36* (2006.01)
*H05K 1/18* (2006.01)
(Continued)

(52) U.S. Cl.
CPC ..... *H01L 23/49861* (2013.01); *H01L 23/3107* (2013.01); *H01L 23/36* (2013.01); *H01L 23/498* (2013.01); *H01L 23/49555* (2013.01); *H01L 23/49838* (2013.01); *H05K 1/182* (2013.01); *H01L 23/467* (2013.01); *H01L 24/16* (2013.01); *H01L 24/32* (2013.01); *H01L 24/48* (2013.01); *H01L 24/73* (2013.01); *H01L 2224/16227* (2013.01); *H01L 2224/32245* (2013.01); *H01L 2224/48247* (2013.01); *H01L 2224/73265* (2013.01); *H01L 2924/15311* (2013.01); *H01L 2924/19041* (2013.01); *H01L 2924/19043* (2013.01); *H01L 2924/19105* (2013.01); *H05K 1/183* (2013.01); *H05K 2201/0919* (2013.01); *H05K 2201/09845* (2013.01); *H05K 2201/10469* (2013.01); *H05K 2201/10757* (2013.01); *H05K 2201/10795* (2013.01)

(58) Field of Classification Search
CPC . H01L 23/3107; H01L 23/36; H01L 23/498; H01L 23/49838; H01L 23/49555
USPC ........................................ 257/666, 692, 696
See application file for complete search history.

(56) References Cited

U.S. PATENT DOCUMENTS

| 4,866,571 | A | * | 9/1989 | Butt ....................... H01L 23/047 174/16.3 |
| 5,025,305 | A | | 6/1991 | Tomisawa et al. |
| 5,122,045 | A | | 6/1992 | Tomisawa et al. |
| 6,194,777 | B1 | * | 2/2001 | Abbott .............. H01L 23/49582 257/666 |

(Continued)

FOREIGN PATENT DOCUMENTS

| JP | H02303176 A | 12/1990 |
| JP | 2003303938 A | 10/2003 |

(Continued)

*Primary Examiner* — Nitin Parekh
(74) *Attorney, Agent, or Firm* — Cantor Colburn LLP

(57) ABSTRACT

A package-in-substrate includes an exposed pad having a surface that is capable of contacting the outside; a semiconductor chip arranged on a surface opposite to the surface of the exposed pad; a molding resin for molding the semiconductor chip; and a lead frame extending from a side surface of the molding resin and having a leading end portion with a machined shape. The leading end portion of the lead frame is cut to have a cutting angel that is an acute angle formed by an extended straight line of the lead frame with respect to a top surface of a package.

15 Claims, 16 Drawing Sheets

(51) Int. Cl.
*H01L 23/00* (2006.01)
*H01L 23/467* (2006.01)

(56) References Cited

U.S. PATENT DOCUMENTS

| | | | |
|---|---|---|---|
| 6,469,321 B2 * | 10/2002 | Arndt | H01L 33/486 257/82 |
| 6,576,983 B1 * | 6/2003 | Fazelpour | H01L 23/13 257/666 |
| 7,245,007 B1 * | 7/2007 | Foster | H01L 23/49527 257/666 |
| 8,294,249 B2 * | 10/2012 | Pilling | H01L 23/49503 257/676 |
| 8,912,670 B2 * | 12/2014 | Teh | H01L 25/18 257/707 |
| 9,153,552 B2 * | 10/2015 | Teh | H01L 25/18 |
| 2014/0291824 A1 * | 10/2014 | Sivaperumal | H01L 23/49541 257/676 |

FOREIGN PATENT DOCUMENTS

| | | |
|---|---|---|
| JP | 2004087998 A | 3/2004 |
| JP | 2005057125 A | 3/2005 |
| JP | 2008270324 A | 11/2008 |
| JP | 2011134990 A | 7/2011 |
| JP | 2011165741 A | 8/2011 |
| JP | 2013038361 A | 2/2013 |

* cited by examiner

PACKAGE-IN-SUBSTRATE, SEMICONDUCTOR DEVICE AND MODULE

CROSS-REFERENCE TO RELATED APPLICATIONS

The present invention claims priority under 35 U.S.C. §119 to Japanese Application No. 2014-160649, filed on Aug. 6, 2014, the entire content of which is incorporated herein by reference.

TECHNICAL FIELD

The present disclosure relates to a package-in-substrate, a semiconductor device, and a module.

BACKGROUND

Due to an increasing demand for miniaturizing and thinning of audio/visual (AV) devices, sizes and thicknesses of components used therein are also reduced. However, in consideration of heat dissipation efficiency, for example, the reduction of the sizes and thicknesses of components is limited within a performance limit.

Meanwhile, for the purpose of thinning of the AV devices, in order to suppress the overall height of a substrate and components, miniaturized components are embedded in a substrate.

However, there is no measure for heat dissipation of components, more particularly, a large scale integration (LSI) circuit, embedded in a substrate.

SUMMARY

The present disclosure provides some embodiments of a package-in-substrate capable of dissipating heat, and a semiconductor device and a module including the package-in-substrate.

According to one embodiment of the present disclosure, there is provided a package-in-substrate, including: an exposed pad having a surface that is capable of contacting the outside; a semiconductor chip arranged on a surface opposite to the surface of the exposed pad; a molding resin for molding the semiconductor chip; and a lead frame extending from a side surface of the molding resin and having a leading end portion with a machined shape. The leading end portion of the lead frame is cut to have a cutting angle that is an acute angle formed by an extended straight line of the lead frame with respect to a top surface of a package.

According to another embodiment of the present disclosure, there is provided a package-in-substrate, including: a substrate in which a package is arranged; an exposed pad having a surface that is capable of contacting the outside; a semiconductor chip arranged on a surface opposite to the surface of the exposed pad; a molding resin for molding the semiconductor chip; and a lead frame extending from a side surface of the molding resin, the lead frame contacting the substrate and having a leading end portion having a terminating edge. The terminating edge of the lead frame is cut to have a cutting angle that is an acute angle formed by an extended straight line of the lead frame with respect to a top surface of the package and the substrate. The terminating edge portion of the lead frame has a cutting surface parallel to the top surface of the package and the substrate. The lead frame is formed such that a height position of a top portion of the lead frames is relatively low compared to a height position of the surface of the exposed pad.

According to still another embodiment of the present disclosure, there is provided a semiconductor device, including the package-in-substrate as described above that is mounted on the substrate. The substrate includes a recessed structure.

According to still another embodiment of the present disclosure, there is provided a semiconductor device, including the package-in-substrate as described above that is mounted on the substrate. The substrate includes an opening.

According to still another embodiment of the present disclosure, there is provided a module, including a first semiconductor device and a second semiconductor device. The first semiconductor device and the second semiconductor device include the package-in-substrate as described above mounted on the substrate. The first semiconductor device and the second semiconductor device are bus-connected to each other via a connector.

DETAILED DESCRIPTION

Figure 1:
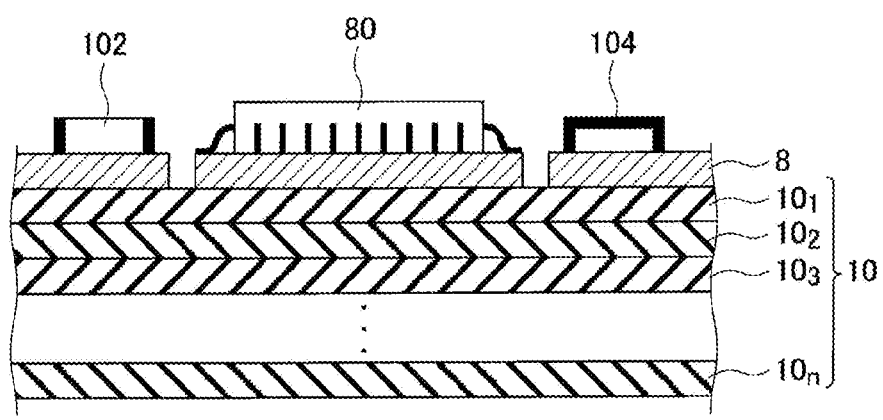
FIG. 1 is a sectional view of a structure according to a comparative example in which a package and circuit components are arranged on a multilayered substrate.

Various embodiments of the present disclosure will be described with reference to the accompanying drawings. In the following description of the drawings, same or similar parts are given same or similar reference numerals. However, it is noted that the drawings are schematic and that the relationship between thickness and planar dimensions, the proportion of thicknesses of layers, and the like are different from real ones. Accordingly, specific thicknesses and dimensions should be determined with reference to the following description. It is certain that some portions have different dimensional relations and proportions between the drawings.

Also, the following embodiments show devices and methods to embody the technical idea of the present disclosure by way of example. The technical ideas of the present disclosure do not specify the materials, shapes, structures, arrangements, and the like of the constituent components to those described below. The technical idea of the present disclosure can be variously changed within the scope of claims.

Furthermore, in the descriptions below, the term 'package' may be synonymously used with the phrase 'inside of a package.'

Comparative Examples

Figure 2:
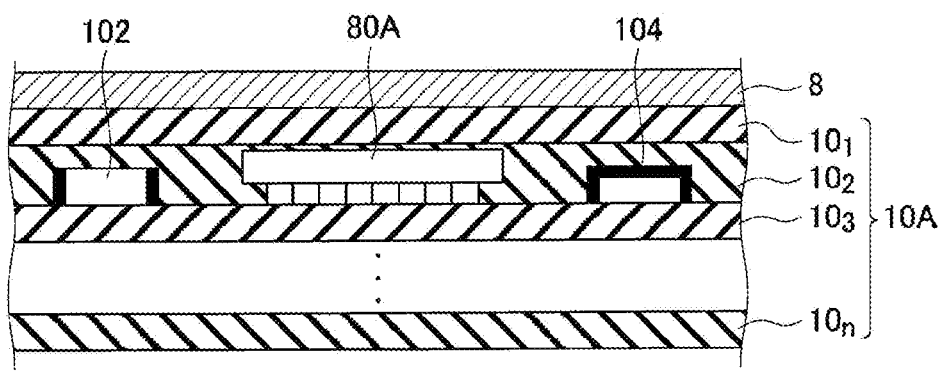
FIG. 2 is a sectional view of a structure according to a comparative example in which a package and circuit components are embedded in a multilayered substrate.

FIG. 1 is a sectional view of a structure according to a comparative example in which a package 80 and circuit components 102 and 104 are arranged on a multilayered substrate 10. FIG. 2 is a sectional view of a structure according to a comparative example in which a package 80A and the circuit components 102 and 104 are embedded in a substrate 10A.

The packages 80 and 80A may have various shapes and may be packages for mounting surface mount devices (SMD). Furthermore, LSIs are included in the packages 80 and 80A. The circuit components 102 and 104 include, for example, a resistor, a capacitor, etc.

The substrate 10 includes a printed circuit board (PCB) formed by stacking substrates $10_1$, $10_2$, $10_3$, . . . , and $10_n$.

In the case of embedding the package 80A having a SMD mounted thereon in the substrate 10A, with the multilayered structure of the substrate 10A, the package 80A may be miniaturized and embedded in the substrate 10A to be electrically connected to electrodes that are formed at an intermediate layer. However, the components to be embedded are not limited to the SMD or miniaturized components.

In the case of a LSI, a ball type package, such as a ball grid array (BGA) and a chip size package (CSP), or a non-leaded type package, such as a small outline non-leaded package (SON) and a very-thin small outline non-leaded package (VSON), may be embedded in the substrate. Alternatively, a semiconductor chip, which is a bare chip not being packaged, may be embedded in the substrate. In any case, no heat dissipation measure is adopted, as well as no heat dissipation measure can be included.

(Substrate Structure)

Figure 3:
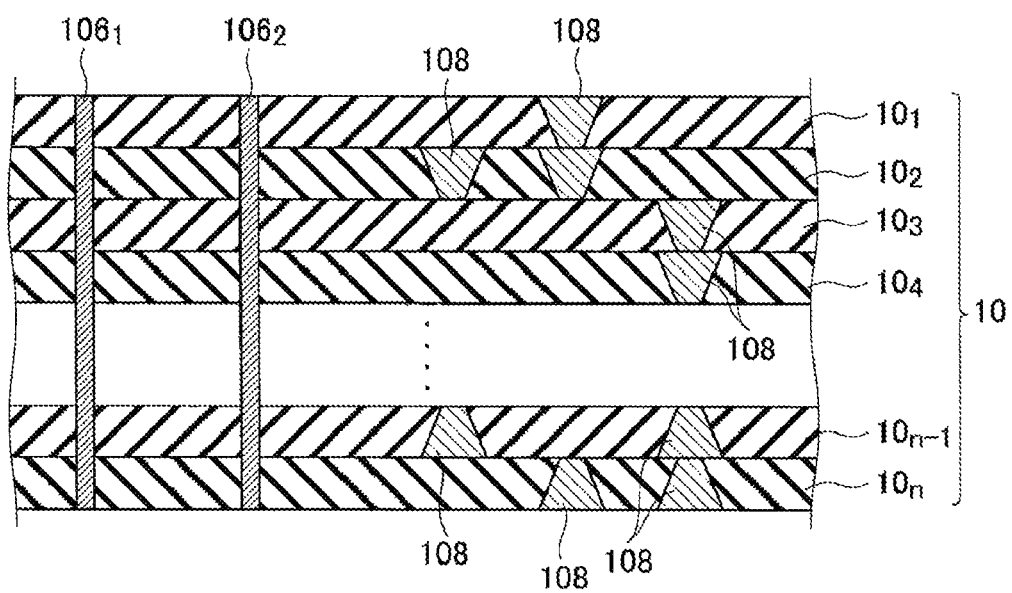
FIG. 3 is a sectional view of a structure of a printed circuit board (PCB) that may be applied to a package-in-substrate according to an embodiment of the present disclosure.

FIG. 3 is a sectional view of a structure of a PCB that may be applied to a package-in-substrate according to an embodiment of the present disclosure.

As shown in FIG. 3, a PCB 10, which may be applied to a package-in-substrate according to an embodiment of the present disclosure, includes substrates $10_1$, $10_2$, $10_3$, . . . , and $10_n$ that are stacked to one another, a plurality of VIA electrodes 108 formed in the substrates $10_1$, $10_2$, $10_3$, . . . , and $10_n$, through-electrodes $106_1$ and $106_2$ that are formed to penetrate through the substrates $10_1$, $10_2$, $10_3$, . . . , and $10_n$. Although not shown, an electrode layer is arranged on a surface of each of the stacked substrates $10_1$, $10_2$, $10_3$, . . . , and $10_n$ to allow an electrical connection to the package-in-substrate.

Detailed descriptions of configurations of package-in-substrates employing the PCB 10 as described above and semiconductor devices including the package-in-substrates will be given below (with reference to FIGS. 16 through 23B).

(Machined Shape of Lead Frame)

According to an embodiment of the present disclosure, positions of semiconductor chips in the package, a formation of lead frames, and machined shapes of the lead frames may be combined to provide a package-in-substrate including a heat dissipation measure. Hereinafter, the machined shapes of lead frames will be described.

Figure 4A:
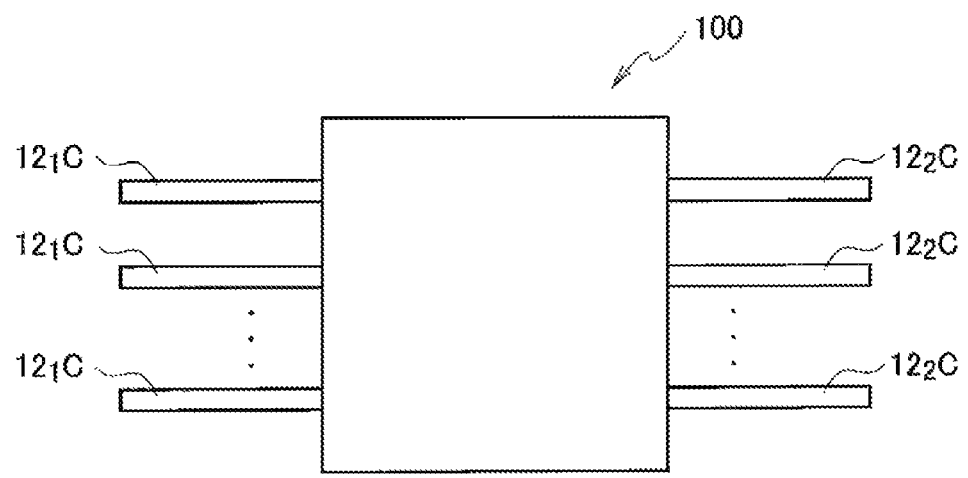
FIG. 4A is a top view of a dual in-line (DIL) package, which is an example of a package-in-substrate according to an embodiment of the present disclosure.
Figure 4B:
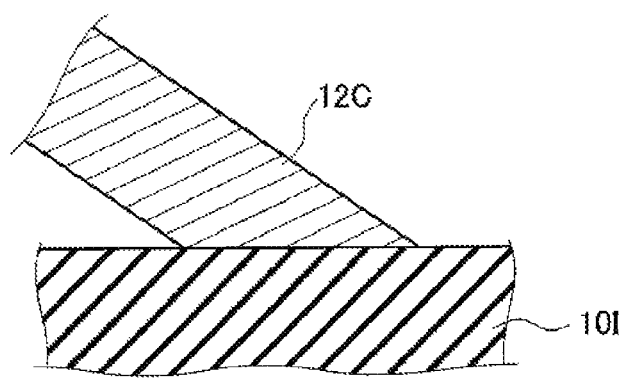
FIG. 4B is a magnified sectional view of a portion of contact between a leading end portion of a lead frame and a substrate of FIG. 4A.

FIG. 4A is a top view of a dual in-line (DIL) package, which is an example of a package-in-substrate 100 according to an embodiment of the present disclosure. FIG. 4B is a magnified sectional view of a portion of contact between a leading end portion of a lead frame 12C ($12_1$C and $12_2$C) of FIG. 4A and a substrate 10I. In FIG. 4B, the lead frame 12C may be either of lead frames $12_1$C and $12_2$C of the DIL package of FIG. 4A. Furthermore, the substrate 10I may be any of the substrates $10_1$, $10_2$, $10_3$, . . . , and $10_n$ shown in FIG. 3.

In the package-in-substrate 100 according to an embodiment of the present disclosure, the leading end portion of the lead frame 12C is machined to have an acute angled surfaces with respect to a top surface of the substrate and the terminating edge parallel to the top surface of the substrate 10I that the leading end portion of the lead frame 12C contacts. Furthermore, although not shown, an electrode pattern is arranged on the surface of the substrate 10I that contacts the leading end portion of the lead frame 12C as shown in FIG. 4B.

Figure 5A:
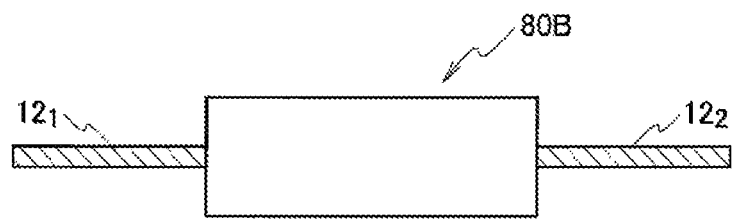
FIG. 5A is a lateral view of a DIL package, which is an example of a package according to a comparative example.
Figure 5B:
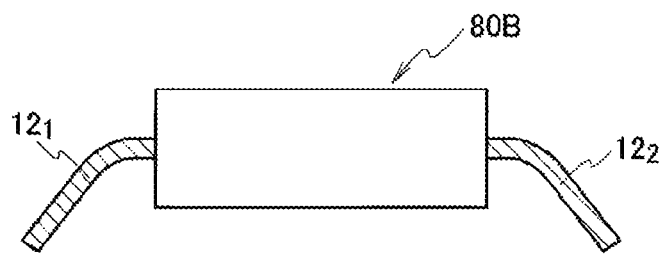
FIG. 5B is a lateral view of a structure formed by bending the lead frames of the package of FIG. 5A.
Figure 6:
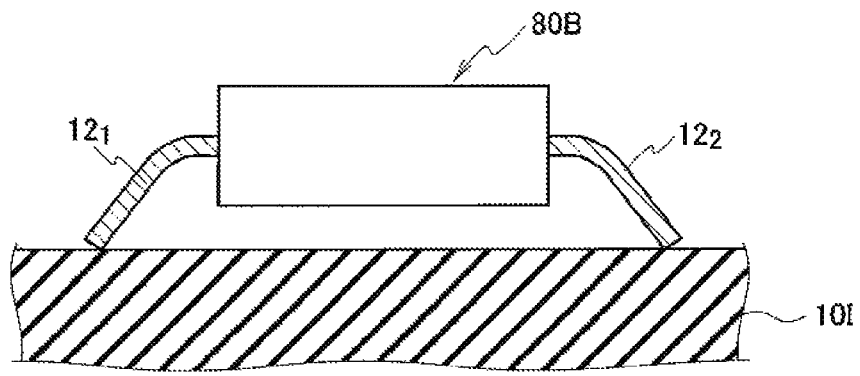
FIG. 6 is a sectional view of the package according to the comparative example shown in FIG. 5B mounted on a substrate.

FIG. 5A is a lateral view of a DIL package, which is an example of a package 80B according to a comparative example. FIG. 5B is a lateral view of a structure formed by bending the lead frames $12_1$C and $12_2$C of the package 80B of FIG. 5A. Furthermore, FIG. 6 is a sectional view of the package 80B according to the comparative example shown in FIG. 5B mounted on the substrate 10I. Furthermore, as in FIG. 4B, although not shown, an electrode pattern is arranged on the surface of the substrate 10I that contacts the leading end portions of the lead frames $12_1$ and $12_2$ as shown in FIG. 6.

Here, as shown in FIG. 6, since the lead frames $12_1$ and $12_2$ and the surface of the substrate 10I contact each other at points, the lead frames $12_1$ and $12_2$ and the surface of the substrate 10I are connected to each other via a solder joint.

Figure 7A:
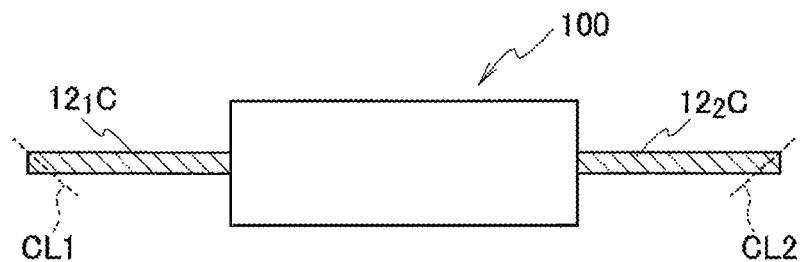
FIG. 7A is a lateral view of a DIL package, which is an example of the package-in-substrate according to an embodiment of the present disclosure and in which the leading end portions of lead frames are cut.
Figure 7B:
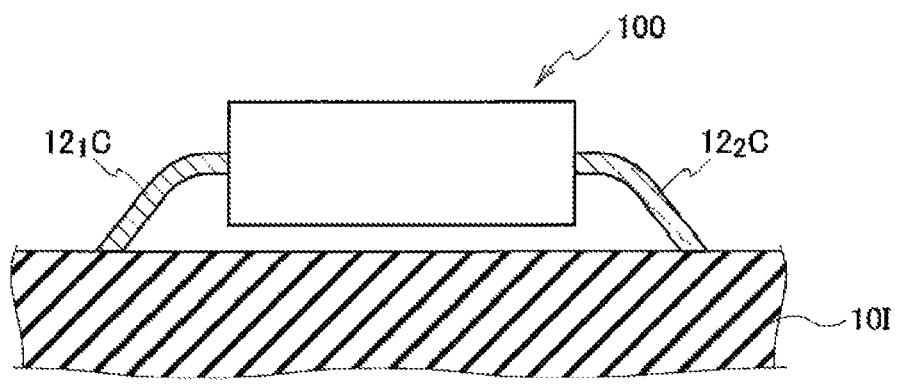
FIG. 7B is a sectional view of a structure that is formed by bending the lead frames of the package-in-substrate of FIG. 7A and mounting the package-in-substrate on a substrate.

Meanwhile, FIG. 7A is a lateral view of a DIL package, which is an example of the package-in-substrate 100 according to an embodiment of the present disclosure, in which the leading end portions of the lead frames $12_1$C and $12_2$C are cut by cut surfaces CL1 and CL2. FIG. 7B is a sectional view of a structure that is formed by bending the lead frames $12_1$C and $12_2$C of the package-in-substrate 100 of FIG. 7A and mounting the package-in-substrate 100 on the substrate 10I.

As shown in FIG. 7B, in the package-in-substrate 100 according to an embodiment of the present disclosure, the leading end portions of the bent lead frames $12_1$C and $12_2$C are machined to have acute angled surfaces with respect to a top surface of the substrate and the terminating edges parallel to the top surface of the substrate 10I that the leading end portions of the lead frames $12_1$C and $12_2$C contact. In other words, the leading end portions of the bent lead frames $12_1$C and $12_2$C include acute angled surfaces with respect to a top surface of the substrate 10I.

To meet the miniaturization of components, it is necessary to remove conventional solder connectors formed at solder joints of the lead frames. When simply removing solder connectors, the size is reduced accordingly but solder adhesiveness is deteriorated. In the package-in-substrate 100 according to an embodiment of the present disclosure, the solder adhesiveness may be preserved since the lead frames $12_1$C and $12_2$C are cut to have acute angled cut portions.

Figure 8:
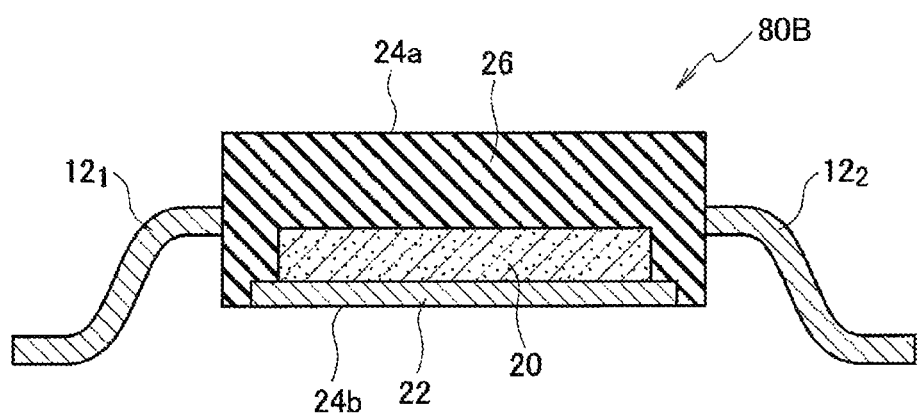
FIG. 8 is a sectional view of the package according to a comparative example.

FIG. 8 is a sectional view of the package 80B according to a comparative example.

As shown in FIG. 8, the package 80B according to the comparative example includes an exposed pad 22, a semiconductor chip 20 arranged on the exposed pad 22, a molding resin 26, and lead frames $12_1$ and $12_2$ that extend from side surfaces of the molding resin 26. The package 80B has a face up structure in which the ground (GND) side of the semiconductor chip 20 is the bottom surface of the semiconductor chip 20 or the wire bonding (W/B) side of the semiconductor chip 20 is the bottom surface of the semiconductor chip 20.

(Arrangement of Semiconductor Chips in Package-In-Substrate)

According to an embodiment of the present disclosure, positions of semiconductor chips in the package, a formation of lead frames, and machined shapes of the lead frames may be combined to provide a package-in-substrate having a heat dissipating measure. Hereinafter, description of the positions of semiconductor chips in the package will be given.

Figure 9:
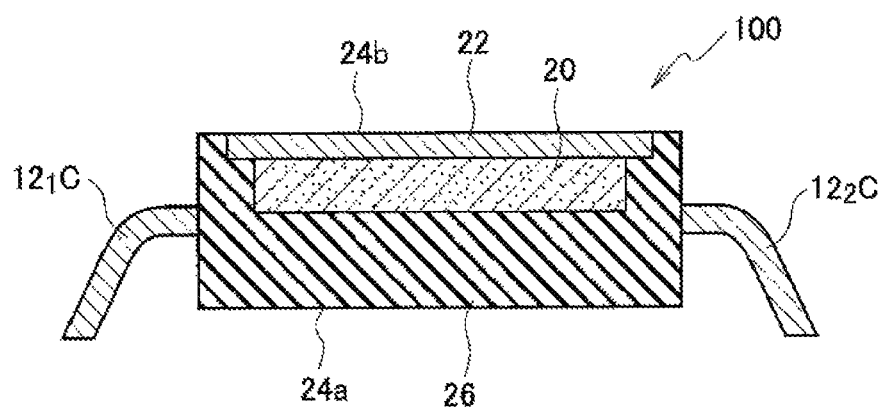
FIG. 9 is a sectional view of a package-in-substrate according to an embodiment of the present disclosure.

FIG. 9 is a sectional view of the package-in-substrate 100 according to an embodiment of the present disclosure.

As shown in FIG. 9, the package-in-substrate 100 according to an embodiment of the present disclosure includes the exposed pad 22, the semiconductor chip 20 arranged on the exposed pad 22, the molding resin 26, and the lead frames $12_1$C and $12_2$C extending from side surfaces of the molding resin 26. The package-in-substrate 100 may have a face down structure in which the ground (GND) side of the semiconductor chip 20 is the top surface of the semiconductor chip 20 or a side of the semiconductor chip 20 opposite to the wire bonding (W/B) side is the top surface of the semiconductor chip 20.

Figure 10:
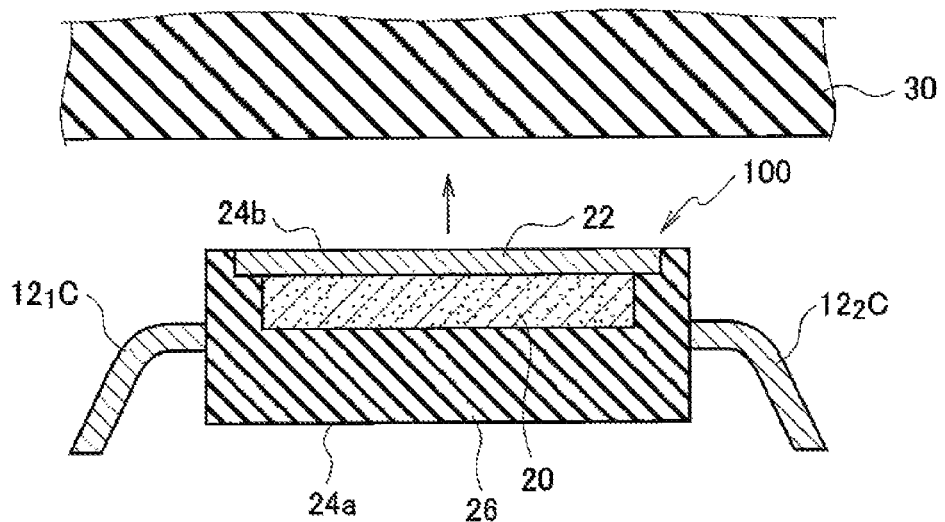
FIG. 10 is a sectional view of a package-in-substrate according to an embodiment of the present disclosure, in which an exposed pad is about to contact a chassis.

FIG. 10 is a sectional view of the package-in-substrate 100 according to an embodiment of the present disclosure, in which the exposed pad 22 is about to contact a chassis 30.

Figure 11:
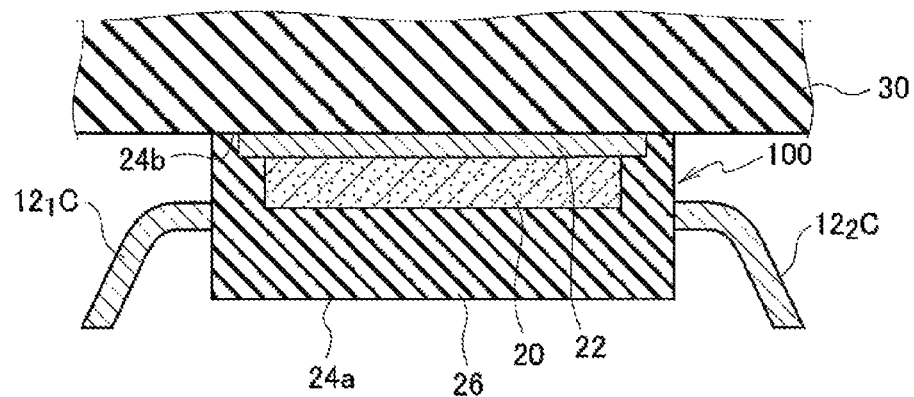
FIG. 11 is a sectional view of a package-in-substrate according to an embodiment of the present disclosure, in which an exposed pad contacts a chassis.

FIG. 11 is a sectional view of the package-in-substrate 100 according to an embodiment of the present disclosure, in which the exposed pad 22 contacts the chassis 30.

In the package-in-substrate 100 according to an embodiment of the present disclosure, since the face down structure in which the ground (GND) side of the semiconductor chip (LSI) 20 is the top surface of the semiconductor chip (LSI) 20 or the side of the semiconductor chip (LSI) 20 opposite to the wire bonding (W/B) side is the top surface of the semiconductor chip (LSI) 20 is employed, the exposed pad 22 may be formed on the top surface of the package-in-substrate 100.

As a result, in the package-in-substrate 100 including the exposed pad 22 formed on the top surface thereof, it is possible to cause the exposed pad (heat dissipating pad) 22 to contact with the chassis 30, thereby providing a heat dissipation measure.

In the package-in-substrate 100 according to an embodiment of the present disclosure, the exposed pad 22 functions as the heat dissipation pad. The exposed pad 22 may also function as the ground (GND) or may be alternatively insulated from the ground potential. In the case of insulating the exposed pad 22 from the ground potential, a thermal conductive sheet for heat dissipation may be interposed between the exposed pad 22 and a heat sink.

If the exposed pad 22 also functions as the ground (GND), a ground (GND) pin may be saved in the package-in-substrate 100, and thus the pin may be used for a different function.

(Formation)

According to an embodiment of the present disclosure, positions of semiconductor chips in the package, a formation of lead frames, and machined shapes of the lead frames may be combined to provide a package-in-substrate having a heat dissipation measure. Hereinafter, description of the formation of lead frames will be given. The lead frames $12_1C$ and $12_2C$ may have arbitrary lengths. Thus, a case in which lengths of the lead frames $12_1C$ and $12_2C$ are relatively long and a case in which lengths of the lead frames $12_1C$ and $12_2C$ are relatively short will be described below.

Figure 12A:
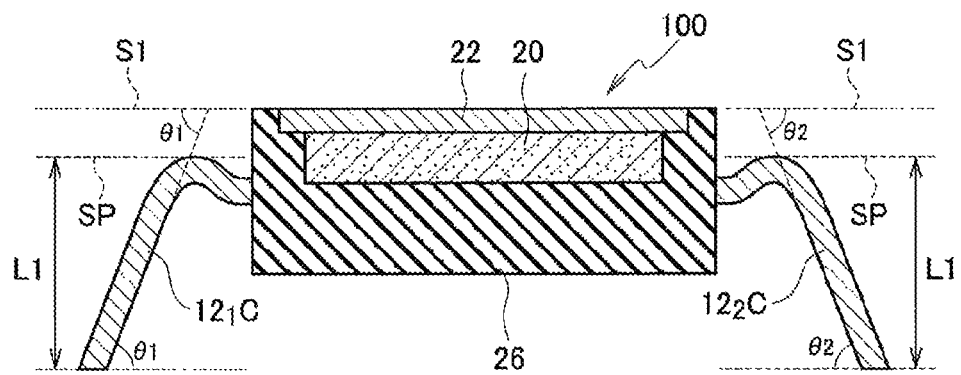
FIG. 12A is a sectional view for describing an operation (formation) for bending lead frames in the case where lengths of the lead frames are relatively long in a package-in-substrate according to an embodiment of the present disclosure.
Figure 12B:
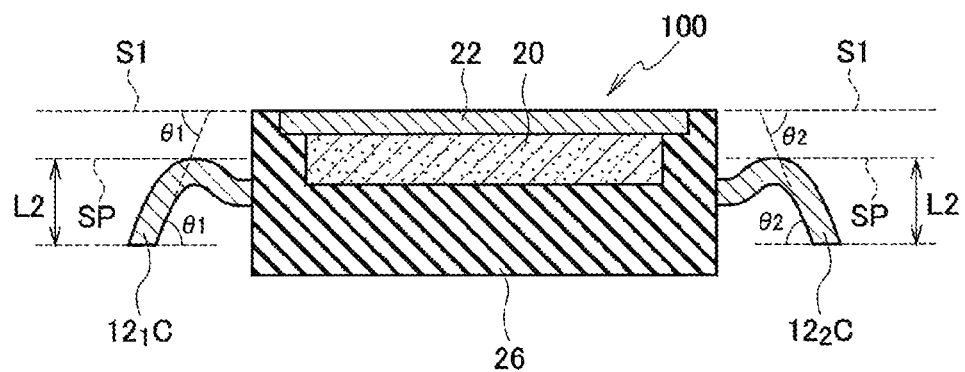
FIG. 12B is a sectional view for describing an operation (formation) for bending lead frames in the case where lengths of the lead frames are relatively short in a package-in-substrate according to an embodiment of the present disclosure.

FIG. 12A is a sectional view for showing an operation (formation) for bending the lead frames $12_1C$ and $12_2C$ in the case where lengths of the lead frames $12_1C$ and $12_2C$ are relatively long in the package-in-substrate 100 according to an embodiment of the present disclosure. FIG. 12B is a sectional view for showing an operation (formation) for bending the lead frames $12_1C$ and $12_2C$ in the case where lengths of the lead frames $12_1C$ and $12_2C$ are relatively short in the package-in-substrate 100 according to an embodiment of the present disclosure.

In FIGS. 12A and 12B, a broken line S1 indicates the level of the top surface of the package-in-substrate 100 that corresponds to the exposed pad 22 according to an embodiment of the present disclosure. A broken line SP indicates the level of the top portions of the formation of the lead frames $12_1C$ and $12_2C$.

As shown in FIG. 12A, in the case in which lengths of the lead frames $12_1C$ and $12_2C$ are relatively long in the package-in-substrate 100, the level SP of the top portions of the formation of the lead frames $12_1C$ and $12_2C$ is lower than the level S1 of the top surface of the package-in-substrate 100 and the leading end portions of the lead frames $12_1C$ and $12_2C$ are formed at a level much lower than the level of the bottom surface of the package-in-substrate 100.

As shown in FIG. 12B, in the case in which lengths of the lead frames $12_1C$ and $12_2C$ are relatively short in the package-in-substrate 100, the level SP of the top portions of the formation of the lead frames $12_1C$ and $12_2C$ is lower than the level S1 of the top surface of the package-in-substrate 100 and the leading end portions of the lead frames $12_1C$ and $12_2C$ are formed at a level higher than the level of the bottom surface of the package-in-substrate 100.

Both of the package-in-substrates 100 according to the embodiments shown in FIGS. 12A and 12B may be embedded in a PCB as shown in FIGS. 16 through 23B as described below.

As shown in FIGS. 12A and 12B, in the package-in-substrate 100 according to an embodiment of the present disclosure, cutting angles θ1 and θ2 of the leading end portions of the lead frames $12_1C$ and $12_2C$ are acute angles formed by an extended straight line (lead frame) with respect to the top surface of a package and a PCB (substrate). In other words, the PCB and cut surfaces of lead frames are parallel to each other.

Figure 13A:
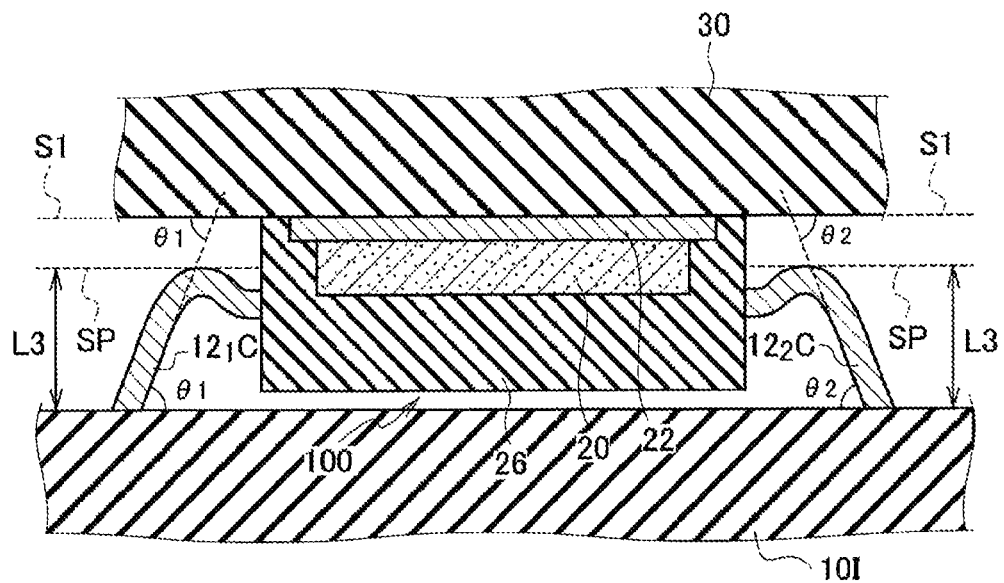
FIG. 13A is a sectional view illustrating that leading end portions of lead frames contact a substrate and an exposed pad contacts a chassis in a package-in-substrate according to an embodiment of the present disclosure.
Figure 13B:
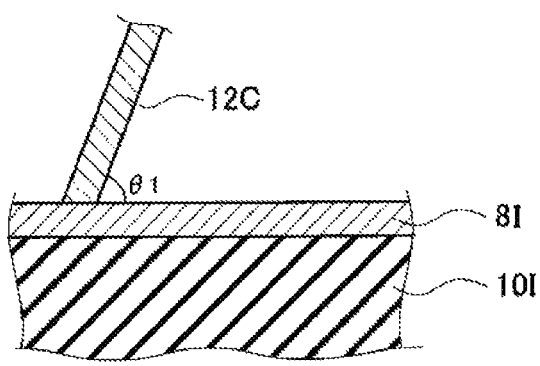
FIG. 13B is a magnified sectional view of a portion of contact between the leading end portion of the lead frame and the substrate of FIG. 13A.

FIG. 13A is a sectional view illustrating that the leading end portions of the lead frames $12_1C$ and $12_2C$ contact the substrate 10I and the exposed pad 22 contacts the chassis 30, with respect to the package-in-substrate 100 according to an embodiment of the present disclosure. FIG. 13B is a magnified sectional view of a portion of contact between the leading end portion of the lead frame 12C and the substrate 10I of FIG. 13A.

The substrate 10I may be any of the substrates $10_1$, $10_2$, $10_3$, ..., and $10_n$ as shown in FIG. 3. Furthermore, as shown in FIG. 13B, a substrate surface pattern electrode 8I is arranged on a portion of the surface of the substrate 10I contacting the leading end portion of the lead frame 12C.

(Heat Sink Structure)

In the package-in-substrate 100 according to an embodiment of the present disclosure, the exposed pad 22 functions as the heat dissipation pad. The exposed pad 22 may also function as the ground (GND) or may be alternatively insulated from the ground potential. In the case of insulating the exposed pad 22 from the ground potential, a thermal conductive sheet for heat dissipation may be interposed between the exposed pad 22 and a heat sink 32.

Figure 14A:
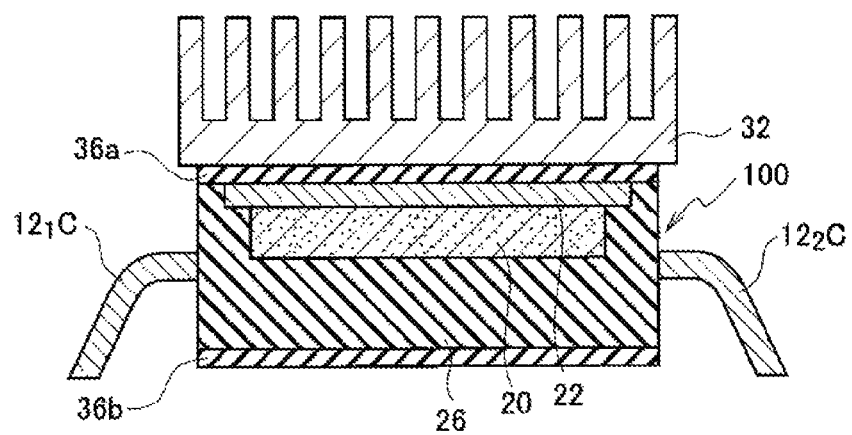
FIG. 14A is a sectional view illustrating that an exposed pad and a heat sink contact each other in a package-in-substrate according to an embodiment of the present disclosure.

FIG. 14A is a sectional view illustrating that the exposed pad 22 and the heat sink 32 contact each other, with respect to the package-in-substrate 100 according to an embodiment of the present disclosure. In the example shown in FIG. 14A, a thermal conductive sheet 36a for heat dissipation is interposed between the top surface of the package-in-substrate 100 and the heat sink 32. In other words, the thermal conductive sheet 36a for heat dissipation secures heat dissipation from the exposed pad 22 and electrically insulates the heat sink 32 and the exposed pad 22 from each other at the same time.

In the same regard, as shown in FIG. 14A, a thermal conductive sheet 36b for heat dissipation may be attached to the bottom surface of the package-in-substrate 100, thereby improving heat dissipation efficiency with respect to a substrate contacting the bottom surface of the package-in-substrate 100.

Furthermore, in the package-in-substrate 100 according to an embodiment of the present disclosure, the exposed pad 22 and the heat sink 32 may directly contact each other. Alternatively, although not shown, a metal electrode may be interposed between the exposed pad 22 and the heat sink 32.

Figure 14B:
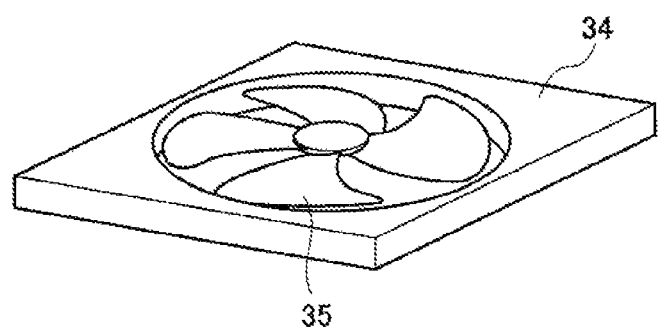
FIG. 14B is a perspective view of a fan including fins that may be applied to a package-in-substrate according to an embodiment of the present disclosure.

FIG. 14B is a perspective view of a fan 34 including fins 35 that may be applied to the package-in-substrate 100 according to an embodiment of the present disclosure.

Figure 15:
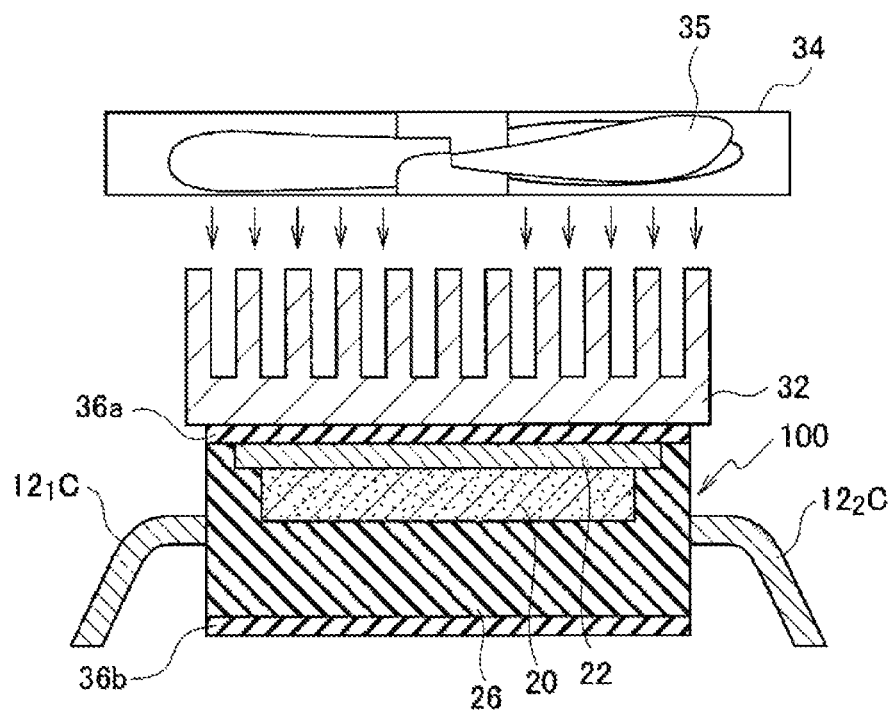
FIG. 15 is a sectional view illustrating that a small fan as shown in FIG. 14B is arranged on a heat sink of a package-in-substrate according to the embodiment shown in FIG. 14A.

FIG. 15 is a sectional view illustrating that a small fan as shown in FIG. 14B is arranged on the heat sink 32, with respect to the package-in-substrate 100 according to the embodiment shown in FIG. 14A. By operating the small fan 34 including the fins 35, heat may be dissipated via forced air-cooling based on the air flow indicated by the arrows in FIG. 15. In other words, heat may be effectively dissipated from the exposed pad 22 on the top surface of the package-in-substrate 100 via forced air-cooling through the heat sink 32.

In the package-in-substrate 100 according to an embodiment of the present disclosure, since the face down structure in which the ground (GND) side of the semiconductor chip (LSI) 20 is the top surface of the semiconductor chip (LSI) 20 or a side of the semiconductor chip (LSI) 20 opposite to the wire bonding (W/B) side is the top surface of the semiconductor chip (LSI) 20 is employed, the exposed pad 22 may be formed on the top surface of the package-in-substrate 100.

As a result, in the package-in-substrate 100 with the exposed pad 22 formed on the top surface thereof, the exposed pad 22 may be caused to contact the chassis 30, thereby providing a heat dissipation measure.

Meanwhile, when merely turning them upside down, the overall height of a substrate and components cannot be reduced. In this regard, in the package-in-substrate 100 according to an embodiment of the present disclosure, the lead frame 12C may be formed to have the structure as described below.

In the package-in-substrate 100 according to an embodiment of the present disclosure, positions of electrodes of the multilayered substrate 10 may be adjusted by adjusting the number of layers (thickness) of the multilayered substrate 10. Thus, when the package-in-substrate 100 contacts the chassis 30, a portion of the top surface contacting the chassis 30 is set to be higher than top surfaces of the other components. If a position of the exposed pad 22 and a position of the lead frame 12C are at the same height, the exposed pad 22 and the lead frame 12C are electrically connected to each other due to the contact to the chassis 30.

Therefore, as shown in FIGS. 12A through 13B, in the package-in-substrate 100 according to an embodiment, the levels of the top portions of the formation of the lead frames $12_1C$ and $12_2C$ are lowered when the lead frames $12_1C$ and $12_2C$ are formed (bent). In other words, the height position SP of the portions of the formation of the lead frames $12_1C$ and $12_2C$ are set to be relatively low compared to the height position SL1 of the top surface of the exposed pad 22 contacting the chassis 30.

In the package-in-substrate 100 according to an embodiment of the present disclosure, the exposed pad 22 that functions as the heat dissipation pad may be exposed and contact the chassis 30, and thus semiconductor integrated circuit components included in a component embedded substrate may also gain the same heat dissipation effect as commonly used SMD components.

Furthermore, in the package-in-substrate 100 according to an embodiment of the present disclosure, a relatively inexpensive quad flat package (QFP) or the like may be embedded in the substrate 10.

The package-in-substrate 100 according to an embodiment of the present disclosure includes a relatively inexpensive lead frame, such as a QFP, where a lead frame is cut to have an angle that is the same as an acute angle formed by an extended straight line (lead frame) with respect to a PCB (substrate) and the top surface of the package. In other words, the PCB and a cut surface of the lead frame are parallel to each other.

According to an embodiment of the present disclosure, positions of semiconductor chips in the package, a formation of lead frames, and machined shapes of the lead frames may be combined to provide a package-in-substrate having a heat dissipating measure.

First Embodiment

Figure 16:
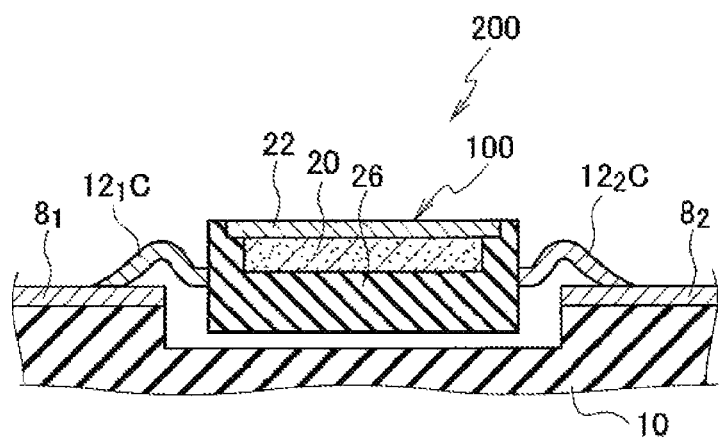
FIG. 16 is a sectional view of a package-in-substrate according to a first embodiment of the present disclosure and a semiconductor device including the package-in-substrate.

FIG. 16 is a sectional view of a package-in-substrate 100 according to a first embodiment of the present disclosure and a semiconductor device 200 including the package-in-substrate 100.

According to the first embodiment of the present disclosure, a substrate 10 includes a recessed structure in which the package-in-substrate 100 is embedded. The semiconductor device 200 including the package-in-substrate 100 according to the first embodiment of the present disclosure includes the substrate 10 having the recessed structure and the package-in-substrate 100 embedded therein.

The recessed structure formed at the substrate 10 may be formed by, for example, adjusting positions of electrodes of the multilayered substrate 10 by adjusting the number of layers (thickness) of the multilayered substrate 10. By embedding the package-in-substrate 100 in the recessed structure, the top surface of the package-in-substrate 100 contacting the chassis or the heat sink may be set to be higher than top surfaces of the other components.

The lead frames $12_1C$ and $12_2C$ are formed to contact the substrate 10 and are connected to substrate surface pattern electrodes $8_1$ and $8_2$. The leading end portions of the lead frames $12_1C$ and $12_2C$ are cut to have cutting angles that are acute angles formed by extended straight lines of the lead frames $12_1C$ and $12_2C$ with respect to the substrate 10.

The lead frames $12_1C$ and $12_2C$ are formed, such that the height positions of the top portions of the lead frames $12_1C$ and $12_2C$ are relatively low compared to the height position of the top surface of the exposed pad 22.

According to the first embodiment of the present disclosure, positions of LSI chips in the package, a formation of lead frames, and machined shapes of the lead frames may be combined to provide a package-in-substrate with a heat dissipating measure and a semiconductor device including the package-in-substrate in a recessed structure of a substrate thereof.

Second Embodiment

Figure 17:
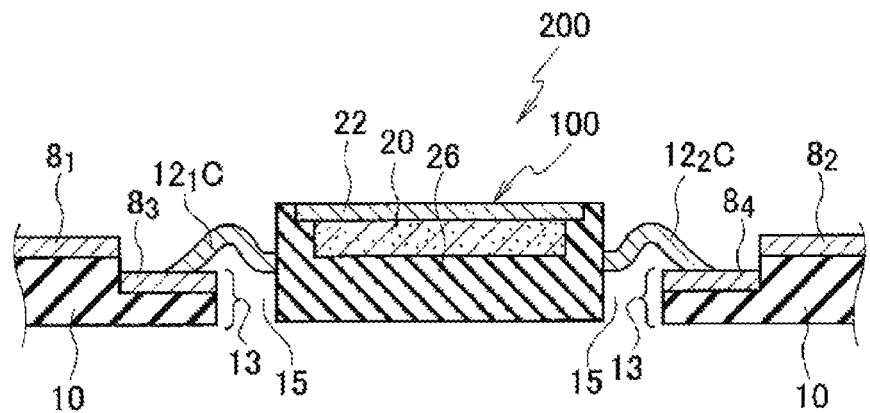
FIG. 17 is a sectional view of a package-in-substrate according to a second embodiment of the present disclosure and a semiconductor device including the package-in-substrate.

FIG. 17 is a sectional view of a package-in-substrate 100 according to a second embodiment of the present disclosure and a semiconductor device 200 including the package-in-substrate 100.

According to the second embodiment of the present disclosure, a substrate 10 includes an opening 15 in which the package-in-substrate 100 is embedded. The semiconductor device 200 including the package-in-substrate 100 according to the second embodiment of the present disclosure includes the substrate 10 having the opening 15 and the package-in-substrate 100 embedded in the opening 15.

Furthermore, the substrate 10 includes a stepped substrate (solder land) 13 surrounding the opening 15.

The opening 15 and the stepped substrate (solder land) 13 formed at the substrate 10 may be formed by adjusting the number of layers (thickness) of the multilayered substrate 10 to adjust positions of electrodes of the multilayered substrate 10. By embedding the package-in-substrate 100 in the opening 15, the top surface of the package-in-substrate 100 contacting the chassis or the heat sink may become higher than top surfaces of the other components.

The lead frames $12_1C$ and $12_2C$ are formed to contact the stepped substrate (solder land) 13 and are connected to stepped substrate surface pattern electrodes $8_3$ and $8_4$. The leading end portions of the lead frames $12_1C$ and $12_2C$ are cut to have cutting angles that are acute angles formed by extended straight lines of the lead frames $12_1C$ and $12_2C$ with respect to the stepped substrate (solder land) 13.

The lead frames $12_1C$ and $12_2C$ are formed, such that the height positions of the top portions of the lead frames $12_1C$ and $12_2C$ are relatively low compared to the height position of the top surface of the exposed pad 22.

According to the second embodiment of the present disclosure, positions of LSI chips in the substrate, a formation of lead frames, and machined shape of the lead frames may be combined to provide a package-in-substrate with a heat dissipating measure and a semiconductor device including the package-in-substrate in a recessed structure of a substrate thereof.

Third Embodiment

Figure 18:
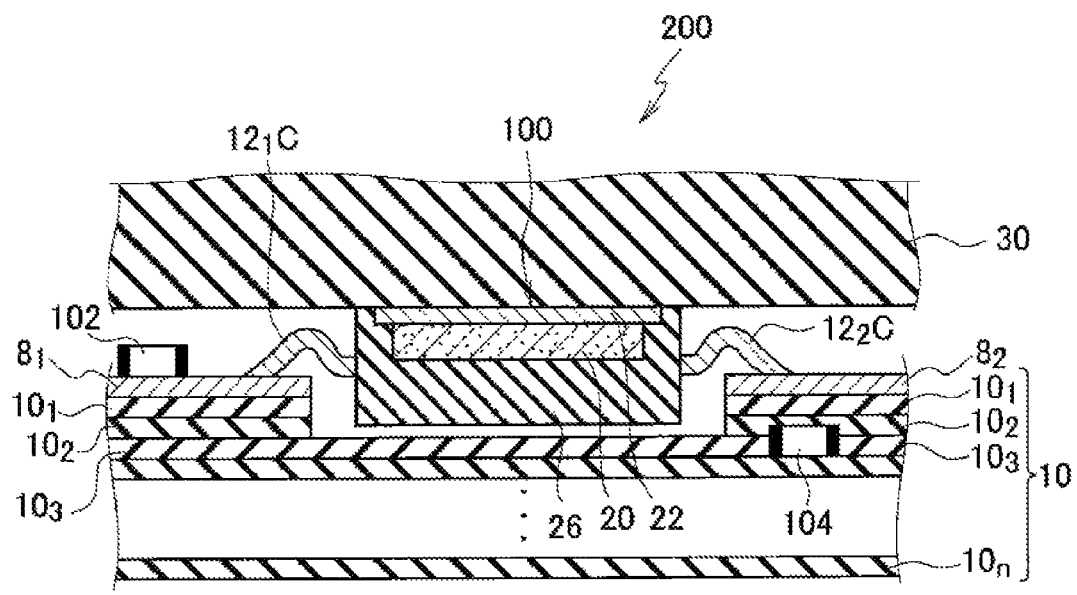
FIG. 18 is a sectional view of a package-in-substrate according to a third embodiment of the present disclosure and a semiconductor device including the package-in-substrate.

FIG. 18 is a sectional view of a package-in-substrate 100 according to a third embodiment of the present disclosure and a semiconductor device 200 including the package-in-substrate 100.

According to the third embodiment of the present disclosure, a substrate 10 includes a recessed structure in which the package-in-substrate 100 is embedded. The semiconductor device 200 including the package-in-substrate 100 according to the third embodiment of the present disclosure includes the substrate 10 having the recessed structure and the package-in-substrate 100 embedded in the recessed structure.

The recessed structure formed at the substrate 10 may be formed by, for example, adjusting the number of layers (thickness) of the multilayered substrates 10 ($10_1$, $10_2$, $10_3$, ..., and $10_n$) to adjust positions of electrodes of the multilayered substrate 10. By embedding the package-in-substrate 100 in the recessed structure, the top surface of the package-in-substrate 100 contacting the chassis 30 may become higher than top surfaces of other circuit components 102 and 104.

The lead frames $12_1$C and $12_2$C are formed to contact the substrate 10 and are connected to substrate surface pattern electrodes $8_1$ and $8_2$. The leading end portions of the lead frames $12_1$C and $12_2$C are cut to have cutting angles that are acute angles formed by extended straight lines of the lead frames $12_1$C and $12_2$C with respect to the substrate 10.

The lead frames $12_1$C and $12_2$C are formed such that the height positions of the top portions of the lead frames $12_1$C and $12_2$C are relatively low compared to the height position of the top surface of the exposed pad 22.

According to the third embodiment of the present disclosure, positions of LSI chips in the package, a formation of lead frames, and machined shapes of the lead frames may be combined to provide a package-in-substrate with a heat dissipating measure and a semiconductor device including the package-in-substrate in a recessed structure of a substrate thereof.

Fourth Embodiment

Figure 19:
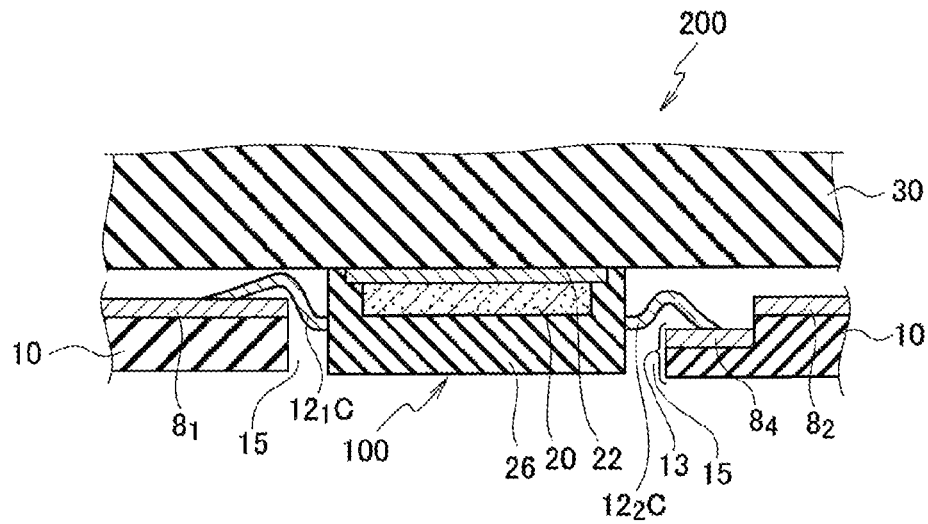
FIG. 19 is a sectional view of a package-in-substrate according to a fourth embodiment of the present disclosure and a semiconductor device including the package-in-substrate.

FIG. 19 is a sectional view of a package-in-substrate 100 according to a fourth embodiment of the present disclosure and a semiconductor device 200 including the package-in-substrate 100.

According to the fourth embodiment of the present disclosure, a substrate 10 includes an opening 15 in which the package-in-substrate 100 is embedded. The semiconductor device 200 including the package-in-substrate 100 according to the fourth embodiment of the present disclosure includes the substrate 10 having the opening 15 and the package-in-substrate 100 embedded in the opening 15.

Furthermore, the substrate 10 includes a stepped substrate (solder land) 13 adjacent to the opening 15.

The opening 15 and the stepped substrate (solder land) 13 formed at the substrate 10 may be formed by adjusting the number of layers (thickness) of the multilayered substrate 10 to adjust positions of electrodes of the multilayered substrate 10. By embedding the package-in-substrate 100 in the opening 15, the top surface of the package-in-substrate 100 contacting the chassis 30 may become higher than top surfaces of the other components.

The lead frames $12_1$C and $12_2$C are formed to contact the stepped substrate (solder land) 13 and are connected to a substrate surface pattern electrode $8_1$ and a stepped substrate surface pattern electrode $8_4$. The leading end portions of the lead frames $12_1$C and $12_2$C are cut to have cutting angles that are acute angles formed by extended straight lines of the lead frames $12_1$C and $12_2$C with respect to the substrate 10 and the stepped substrate (solder land) 13.

The lead frames $12_1$C and $12_2$C are formed such that the height positions of the top portions of the lead frames $12_1$C and $12_2$C are relatively low compared to the height position of the top surface of the exposed pad 22.

According to the fourth embodiment of the present disclosure, the lead frame $12_2$C is formed to contact the stepped substrate (solder land) 13 and is connected to the stepped substrate surface pattern electrode $8_4$, thereby reducing the number of VIA electrodes in a substrate.

According to the fourth embodiment of the present disclosure, positions of LSI chips in the package, a formation of lead frames, and machined shapes of the lead frames may be combined to provide a package-in-substrate with a heat dissipating measure and a semiconductor device including the package-in-substrate in the recessed structure of the substrate thereof.

Fifth Embodiment

Figure 20:
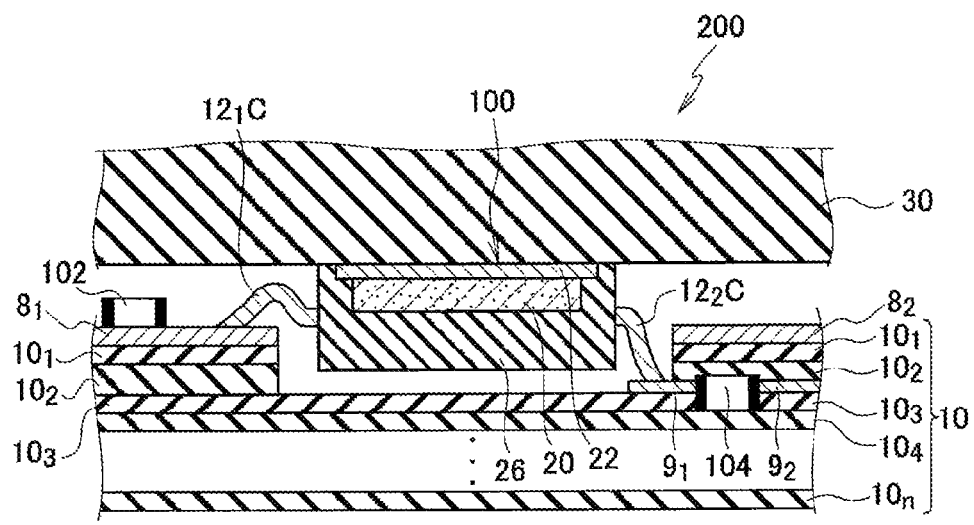
FIG. 20 is a sectional view of a package-in-substrate according to a fifth embodiment of the present disclosure and a semiconductor device including the package-in-substrate.

FIG. 20 is a sectional view of a package-in-substrate 100 according to a fifth embodiment of the present disclosure and a semiconductor device 200 including the package-in-substrate 100.

According to the fifth embodiment of the present disclosure, a substrate 10 includes a recessed structure in which the package-in-substrate 100 is embedded. The semiconductor device 200 including the package-in-substrate 100 according to the fifth embodiment of the present disclosure includes the substrate 10 having the recessed structure and the package-in-substrate 100 embedded in the recessed structure.

The recessed structure formed at the substrate 10 may be formed by, for example, adjusting the number of layers (thickness) of the multilayered substrates 10 ($10_1$, $10_2$, $10_3$, ..., and $10_n$) to adjust positions of electrodes of the multilayered substrate 10. By embedding the package-in-substrate 100 in the recessed structure, the top surface of the package-in-substrate 100 contacting the chassis 30 may become higher than top surfaces of other circuit components 102 and 104.

The lead frames $12_1$C and $12_2$C are formed to contact the substrates $10_1$ and $10_3$ and are connected to a substrate surface pattern electrode $8_1$ and an electrode $9_1$ of an inner stacked layer of the multilayered substrate. Furthermore, the electrode $9_1$ and an electrode $9_2$ of the inner stacked layer of the multilayered substrate are connected to the circuit component 104.

The leading end portions of the lead frames $12_1$C and $12_2$C are cut to have cutting angles that are acute angles formed by extended straight lines of the lead frames $12_1$C and $12_2$C with respect to the substrates $10_1$ and $10_3$.

The lead frames $12_1$C and $12_2$C are formed such that the height positions of the top portions of the lead frames $12_1$C and $12_2$C are relatively low compared to the height position of the top surface of the exposed pad 22.

According to the fifth embodiment of the present disclosure, the lead frame $12_2$C is formed to contact the substrate $10_3$ and is connected to the electrode $9_1$ of the inner stacked layer of the multilayered substrate, thereby reducing the number of VIA electrodes in a substrate.

According to the fifth embodiment of the present disclosure, positions of LSI chips in the package, a formation of lead frames, and machined shapes of the lead frames may be combined to provide a package-in-substrate with a heat dissipating measure and a semiconductor device including the package-in-substrate in the recessed structure of the substrate thereof.

Sixth Embodiment

Figure 21:
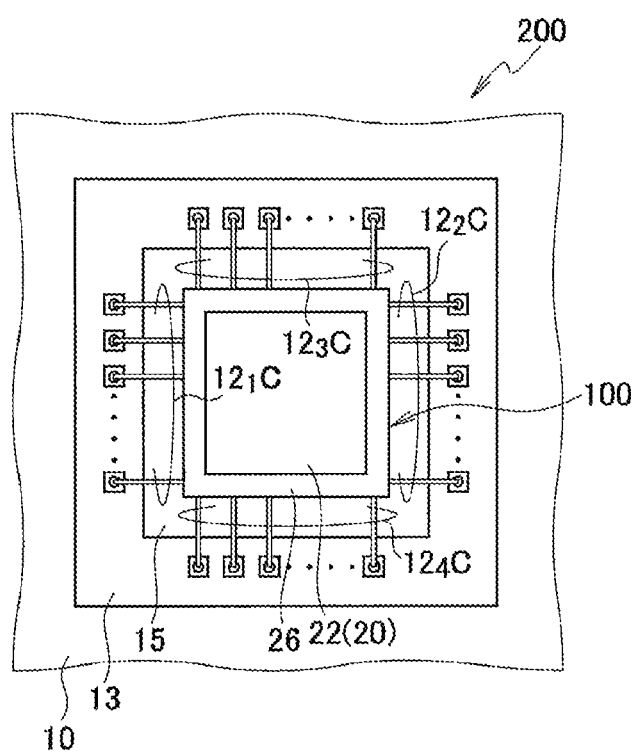
FIG. 21 is a plan view of a package-in-substrate according to a sixth embodiment of the present disclosure and a semiconductor device including the package-in-substrate.

FIG. 21 is a plan view of a package-in-substrate 100 according to a sixth embodiment of the present disclosure and a semiconductor device 200 including the package-in-substrate 100.

According to the sixth embodiment of the present disclosure, as shown in FIG. 21, the package-in-substrate 100 has a QFP structure including lead frames $12_1C$, $12_2C$, $12_3C$, and $12_4C$.

According to the sixth embodiment of the present disclosure, similarly to the second embodiment shown in FIG. 17, a substrate 10 includes an opening 15 in which the package-in-substrate 100 is embedded. The semiconductor device 200 including the package-in-substrate 100 according to the sixth embodiment of the present disclosure includes the substrate 10 having the opening 15 and the package-in-substrate 100 embedded in the opening 15.

Furthermore, the substrate 10 includes a stepped substrate (solder land) 13 adjacent to the opening 15.

The opening 15 and the stepped substrate (solder land) 13 formed at the substrate 10 may be formed by adjusting the number of layers (thickness) of the multilayered substrate 10 to adjust positions of electrodes of the multilayered substrate 10. By embedding the package-in-substrate 100 in the opening 15, the top surface of the package-in-substrate 100 contacting a chassis or a heat sink may become higher than top surfaces of the other components.

The lead frames $12_1C$, $12_2C$, $12_3C$, and $12_4C$ are formed to contact the substrate 10 and the stepped substrate (solder land) 13 and are connected to a substrate surface pattern electrode and a stepped substrate surface pattern electrode. The leading end portions of the lead frames $12_1C$, $12_2C$, $12_3C$, and $12_4C$ are cut to have cutting angles that are acute angles formed by extended straight lines of the lead frames $12_1C$, $12_2C$, $12_3C$, and $12_4C$ with respect to the substrates 10 and the stepped substrate (solder land) 13.

The lead frames $12_1C$, $12_2C$, $12_3C$, and $12_4C$ are formed such that the height positions of the top portions of the lead frames $12_1C$, $12_2C$, $12_3C$, and $12_4C$ are relatively low compared to the height position of the top surface of the exposed pad 22.

According to the sixth embodiment of the present disclosure, positions of LSI chips in the package, a formation of lead frames, and machined shapes of the lead frames may be combined to provide a package-in-substrate with a heat dissipating measure and a semiconductor device including the package-in-substrate in a recessed structure of the substrate thereof.

Seventh Embodiment

Figure 22:
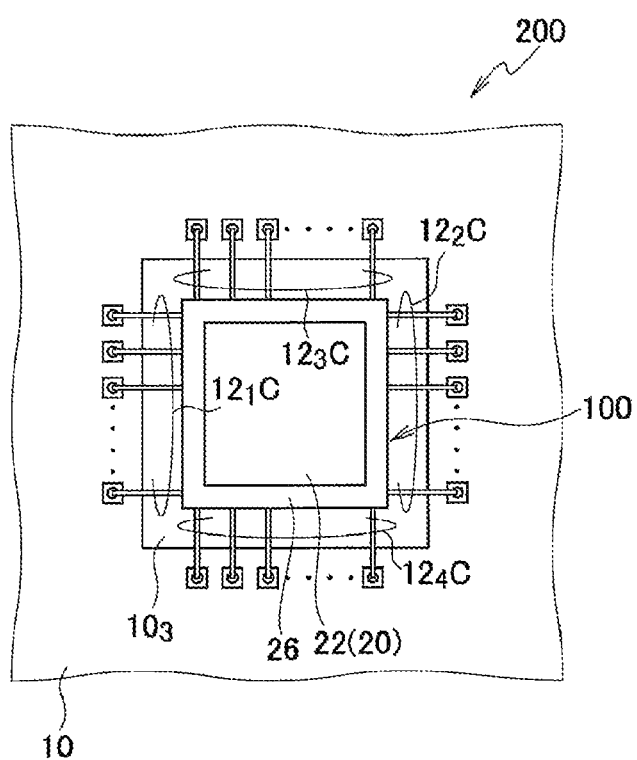
FIG. 22 is a plan view of a package-in-substrate according to a seventh embodiment of the present disclosure and a semiconductor device including the package-in-substrate.

FIG. 22 is a plan view of a package-in-substrate 100 according to a seventh embodiment of the present disclosure and a semiconductor device 200 including the package-in-substrate 100.

According to the seventh embodiment of the present disclosure, as shown in FIG. 22, the package-in-substrate 100 has a QFP structure including lead frames $12_1C$, $12_2C$, $12_3C$, and $12_4C$.

According to the seventh embodiment of the present disclosure, similarly to the third embodiment shown in FIG. 18, a substrate 10 includes a recessed structure in which the package-in-substrate 100 is embedded. The semiconductor device 200 including the package-in-substrate 100 according to the seventh embodiment of the present disclosure includes the substrate 10 having the recessed structure and the package-in-substrate 100 embedded in the recessed structure.

The recessed structure formed at the substrate 10 may be formed by, for example, adjusting the number of layers (thickness) of the multilayered substrates 10 ($10_1$, $10_2$, $10_3$, . . . , and $10_n$) to adjust positions of electrodes of the multilayered substrate 10. By embedding the package-in-substrate 100 in the recessed structure, the top surface of the package-in-substrate 100 contacting a chassis or a heat sink may become higher than top surfaces of other components.

The lead frames $12_1C$, $12_2C$, $12_3C$, and $12_4C$ are formed to contact the substrate 10 and are connected to a substrate surface pattern electrode. The leading end portions of the lead frames $12_1C$, $12_2C$, $12_3C$, and $12_4C$ are cut to have cutting angles that are acute angles formed by extended straight lines of the lead frames $12_1C$, $12_2C$, $12_3C$, and $12_4C$ with respect to the substrate 10.

The lead frames $12_1C$, $12_2C$, $12_3C$, and $12_4C$ are formed such that the height positions of the top portions of the lead frames $12_1C$, $12_2C$, $12_3C$, and $12_4C$ are relatively low compared to the height position of the top surface of the exposed pad 22.

According to the seventh embodiment of the present disclosure, positions of LSI chips in the package, a formation of lead frames, and machined shapes of the lead frames may be combined to provide a package-in-substrate with a heat dissipating measure and a semiconductor device including the package-in-substrate in the recessed structure of the substrate thereof.

Eighth Embodiment

Module

Figure 23A:
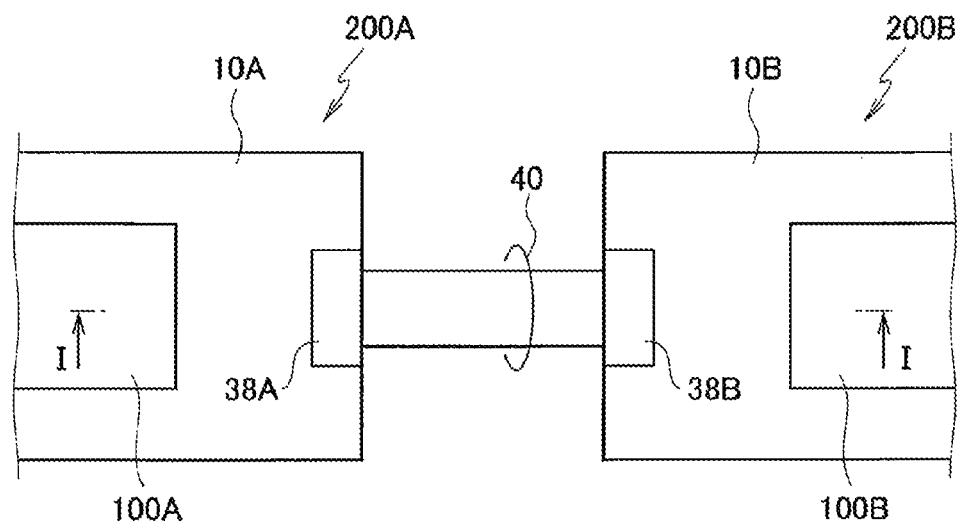
FIG. 23A is a plan view of package-in-substrates and according to an eighth embodiment of the present disclosure and semiconductor devices including the package-in-substrates.
Figure 23B:
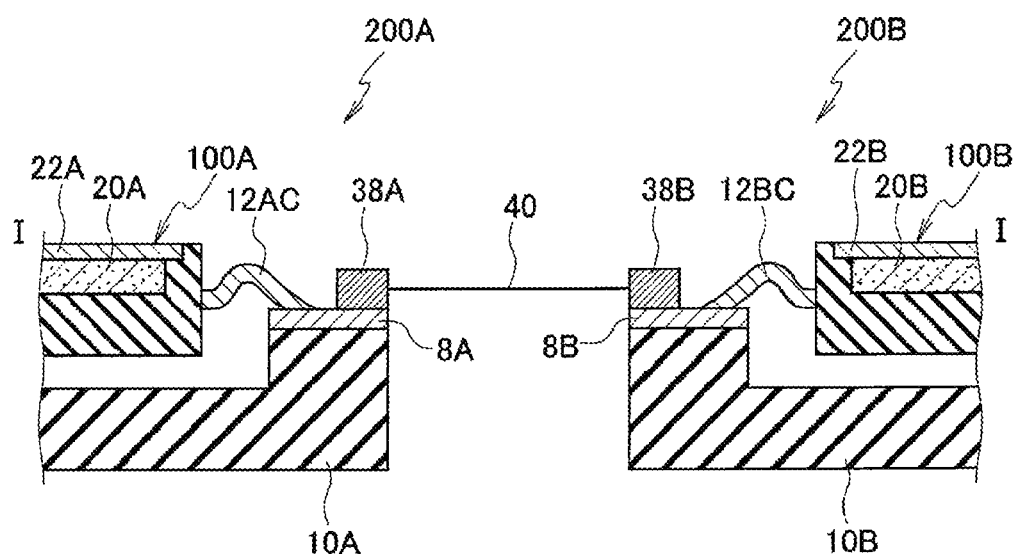
FIG. 23B is a sectional view taken along a line I-I of FIG. 23A.

FIG. 23A is a plan view of package-in-substrates 100A and 100B according to an eighth embodiment of the present disclosure and semiconductor devices 200A and 200B including the package-in-substrates 100A and 100B. FIG. 23B is a sectional view taken along a line I-I of FIG. 23A.

According to the eighth embodiment of the present disclosure, the package-in-substrates 100A and 100B are embedded in respective recessed structures formed at substrates 10A and 10B, and are connected to each other through a bus connecting line 40 connected between connectors 38A and 38B. Here, the connectors 38A and 38B are arranged on substrate surface pattern electrodes 8A and 8B of the substrates 10A and 10B, respectively.

According to the eighth embodiment of the present disclosure, similarly to the third embodiment shown in FIG. 18, the substrates 10A and 10B include the recessed structures, and the package-in-substrates 100A and 100B are embedded in the recessed structures, respectively. The semiconductor devices 200A and 200B including the package-in-substrates 100A and 100B according to the eighth embodiment of the present disclosure includes the substrates 10A and 10B including the recessed structures and the package-in-substrates 100A and 100B embedded in the recessed structures.

The recessed structures formed at the substrates 10A and 10B may be formed by, for example, adjusting the number of layers (thickness) of the multilayered substrates to adjust positions of electrodes of the multilayered substrate 10. By embedding the package-in-substrates 100A and 100B in the recessed structures, the top surfaces of the package-insubstrates 100A and 100B contacting a chassis or a heat sink may become higher than top surfaces of other circuit components or the connectors 38A and 38B.

The lead frames 12AC and 12BC are formed to contact the substrates 10A and 10B and are connected to substrate surface pattern electrodes 8A and 8B. The leading end portions of the lead frames 12AC and 12BC are cut to have cutting angles that are acute angles formed by extended straight lines of the lead frames 12AC and 12BC with respect to the substrates 10A and 10B.

The lead frames 12AC and 12BC are formed such that the height positions of the top portions of the lead frames 12AC and 12BC are relatively low compared to the height position of the top surface of exposed pads 22A and 22B.

According to the eighth embodiment of the present disclosure, positions of LSI chips in the package, a formation of lead frames, and machined shapes of the lead frames may be combined to provide a plurality of package-in-substrates with heat dissipating measures and semiconductor devices including recessed structures in which the plurality of package-in-substrate are included.

Furthermore, although the example related to the substrate having the recessed structure is described above, the substrate may alternatively include an opening. Furthermore, a configuration in which the top surface of the package-in-substrate contacts the chassis or the heat sink may be alternatively employed.

According to the eighth embodiment of the present disclosure, a module including a semiconductor device 200A and a second semiconductor device 200B, which are bus-connected to each other via connectors, may be provided.

Figure 24:
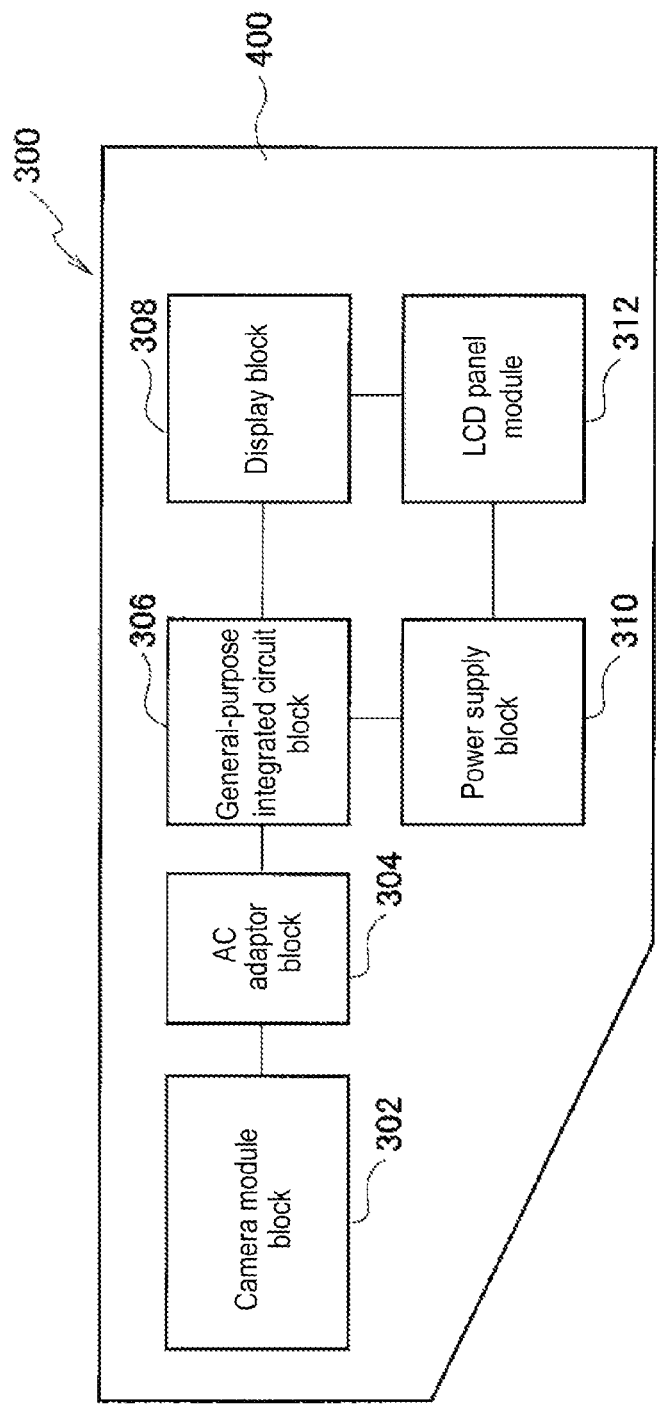
FIG. 24 is a block diagram of a digital still camera (DSC) module to which a package-in-substrate according to the eighth embodiment of the present disclosure and a semiconductor device including the package-in-substrate may be applied.

FIG. 24 is a block diagram of a digital still camera (DSC) module 300 to which a package-in-substrate according to the eighth embodiment of the present disclosure and a semiconductor device including the package-in-substrate may be applied.

As shown in FIG. 24, the DSC module 300 is mounted on a camera mounting substrate 400 and includes a camera module block 302, an AC adaptor block 304, a general-purpose integrated circuit block 306, a power supply block 310, a display block 308, and a LCD panel module 312. Like the eighth embodiment, the respective blocks may be connected to one another via bus connecting lines. The blocks shown in FIG. 24 may be configured with the package-in-substrates with heat dissipation measures and the semiconductor devices including the package-in-substrates.

According to the present disclosure in some embodiments, it is possible to provide a package-in-substrate capable of dissipating heat and a semiconductor device and a module including the package-in-substrate.

Other Embodiments

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures.

The accompanying claims and their equivalents are intended to cover such forms or modifications as would fall within the scope and spirit of the disclosures.

INDUSTRIAL APPLICABILITY

Based on heat dissipation capability, a package-in-substrate according to an embodiment of the present disclosure and a semiconductor device and a module including the package-in-substrate may be applied to wide fields of application, e.g., miniaturized and thinned AV devices, smart phones, tablet PCs, personal computers, etc.

What is claimed is:

1. A package-in-substrate, comprising:
an exposed pad having a surface that is capable of contacting the outside;
a semiconductor chip arranged on a surface opposite to the surface of the exposed pad;
a substrate in which a package is embedded;
a molding resin for molding the semiconductor chip; and
a lead frame extending from a side surface of the molding resin and having a leading end portion having a terminating edge,
wherein the lead frame is formed to contact the substrate, and the leading end portion of the lead frame terminates in acute angled surfaces with respect to a top surface of the substrate and the terminating edge being parallel to the top surface of the substrate and directly contacting the top surface of the substrate.

2. The package-in-substrate of claim 1, wherein the semiconductor chip has a face down structure in which a ground side is on a top surface of the semiconductor chip.

3. The package-in-substrate of claim 1, wherein the semiconductor chip has a face down structure in which a surface opposite to a wire bonding surface is on a top surface of the semiconductor chip.

4. The package-in-substrate of claim 1, wherein the surface of the exposed pad is capable of contacting a chassis.

5. The package-in-substrate of claim 4, comprising a first thermal conductive sheet,
wherein the surface of the exposed pad is capable of contacting the chassis via the first thermal conductive sheet.

6. The package-in-substrate of claim 4, wherein the substrate comprises a multilayered substrate,
wherein a position of an electrode of the multilayered substrate is adjusted by adjusting a number of layers of the multilayered substrate so that the top surface of the package contacting the chassis is set to be higher than top surfaces of other components.

7. The package-in-substrate of claim 1, wherein the surface of the exposed pad is capable of contacting a heat sink.

8. The package-in-substrate of claim 7, comprising a first thermal conductive sheet,
wherein the surface of the exposed pad is capable of contacting the heat sink via the first thermal conductive sheet.

9. The package-in-substrate of claim 1, comprising a second thermal conductive sheet arranged under the molding resin,
wherein the package-in-substrate is capable of contacting the substrate via the second thermal conductive sheet.

10. The package-in-substrate of claim 1, wherein the lead frame is formed such that a height position of a top portion of the lead frame is relatively low compared to a height position of the surface of the exposed pad.

11. The package-in-substrate of claim 1, comprising a dual in line package or a quad flat package.

12. A semiconductor device, comprising the package-in-substrate of claim 1 mounted on the substrate, wherein the substrate includes a recessed structure.

13. A semiconductor device, comprising the package-in-substrate of claim 1 mounted on the substrate, wherein the substrate includes an opening.

14. A module, comprising a first semiconductor device and a second semiconductor device,
   wherein the first semiconductor device and the second semiconductor device include the package-in-substrate of claim 1 mounted on the substrate, and
   wherein the first semiconductor device and the second semiconductor device are bus-connected to each other via a connector.

15. A package-in-substrate, comprising:
   a substrate in which a package is arranged;
   an exposed pad having a surface that is capable of contacting the outside;
   a semiconductor chip arranged on a surface opposite to the surface of the exposed pad;
   a molding resin for molding the semiconductor chip; and
   a lead frame extending from a side surface of the molding resin, the lead frame contacting the substrate and having a leading end portion having a terminating edge,
   wherein the leading end portion of the lead frame terminates in acute angled surfaces with respect to a top surface of the substrate and the terminating edge being parallel to the top surface of the substrate and directly contacting the top surface of the substrate, and
   wherein the lead frame is formed such that a height position of a top portion of the lead frame is relatively low compared to a height position of the surface of the exposed pad.

* * * * *